United States Patent
Kim et al.

(10) Patent No.: US 10,566,562 B2
(45) Date of Patent: Feb. 18, 2020

(54) ORGANIC LIGHT-EMITTING DEVICE AND ORGANIC LIGHT-EMITTING DISPLAY USING THE SAME

(71) Applicant: LG Display Co., Ltd., Seoul (KR)

(72) Inventors: Byung-Soo Kim, Goyang-si (KR); Han-Byeol Seok, Seoul (KR); Seok-Hyun Kim, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 240 days.

(21) Appl. No.: 15/663,073

(22) Filed: Jul. 28, 2017

(65) Prior Publication Data
US 2018/0033995 A1    Feb. 1, 2018

(30) Foreign Application Priority Data
Jul. 29, 2016    (KR) .................. 10-2016-0097551

(51) Int. Cl.
*H01L 51/50* (2006.01)
*H01L 51/52* (2006.01)

(52) U.S. Cl.
CPC ...... *H01L 51/5044* (2013.01); *H01L 51/5004* (2013.01); *H01L 51/5088* (2013.01); *H01L 51/5056* (2013.01); *H01L 51/5203* (2013.01)

(58) Field of Classification Search
None
See application file for complete search history.

(56) References Cited

U.S. PATENT DOCUMENTS

2003/0170491 A1* 9/2003 Liao ............... H01L 51/5036
    428/690
2006/0083946 A1* 4/2006 Lee ............... H01L 51/5048
    428/690
2011/0215308 A1    9/2011 Im et al.
2012/0248468 A1* 10/2012 Song ............... H01L 51/5253
    257/88
2015/0097161 A1    4/2015 Song et al.
2015/0236264 A1    8/2015 Kim et al.

FOREIGN PATENT DOCUMENTS

CN    104518126 A    4/2015
CN    104868057 A    8/2015

OTHER PUBLICATIONS

Extended European Search Report dated Nov. 27, 2017, issued in corresponding European Application No. 17182739.7.
Hin-Wai Mo et al., "Multi-Alternating Organic Semiconducting Films with High Electric Conductivity," Advanced Functional Materials, Wiley-VCH Verlag GmbH & Co, KGaA, Weinheim, vol. 24, No. 34, pp. 5375-5379, doi:10.1002/adfm.201400468, XP001591632, Sep. 10, 2014.
Chinese Office Action dated Dec. 5, 2018, issued by the Chinese Patent Office for counterpart Chinese Patent Application No. 201710639549.9.

* cited by examiner

*Primary Examiner* — Gregory D Clark
(74) *Attorney, Agent, or Firm* — Morgan, Lewis & Bockius LLP (57) ABSTRACT

An organic light-emitting device includes: an anode and a cathode opposite each other, an organic light-emitting layer between the anode and the cathode, and a hole transport unit between the anode and the organic light-emitting layer and including two or more pairs of hole injection layers and hole transport layers each formed of a respective single material, the hole injection layers and the hole transport layers being alternately stacked.

10 Claims, 7 Drawing Sheets

ORGANIC LIGHT-EMITTING DEVICE AND ORGANIC LIGHT-EMITTING DISPLAY USING THE SAME

CROSS-REFERENCE TO RELATED APPLICATION(S)

This application claims the priority of Korean Application No. 10-2016-0097551, filed on Jul. 29, 2016, the entirety of which is hereby incorporated by reference.

BACKGROUND

1. Technical Field

The present disclosure relates to an organic light-emitting device, and more particularly, to an organic light-emitting device with improved hole injection at the anode, and an organic-light-emitting display using the same.

2. Discussion of the Related Art

In the information age, the field of displays visually expressing signals related to electrical information has rapidly developed. To satisfy such a trend, various flat display devices having excellent performance, such as thinness, light weight, and low power consumption, have been researched as a substitute for a conventional cathode ray tube (CRT) display device. Examples of flat display devices include liquid crystal displays (LCDs), plasma display panels (PDPs), field emission displays (FEDs), organic light-emitting diode (OLED) displays, etc. The OLED display requires no separate light source, and has been considered to be competitive in achieving compactness and good color reproduction.

The OLED display includes self-emissive elements, such as organic light-emitting devices, in sub-pixels. Each sub-pixel displays a portion of an image by operation of the organic light-emitting device. Further, organic light-emitting devices may be used as self-emissive elements in a lighting apparatus, as well as a display. Thus, development of organic light-emitting devices has recently been spotlighted in the field of lighting. Moreover, organic light-emitting devices do not require a separate light source unit, and may be easily used in a flexible display device or a transparent display device.

The organic light-emitting device includes an organic light-emitting layer between an anode and a cathode. Holes and electrons from the anode and cathode are injected into the organic light-emitting layer, and are combined with each other in the organic light-emitting layer, thus generating excitons. When the generated excitons are changed from an excited state to a ground state, the organic light-emitting device emits light.

However, in a related art organic light-emitting device, holes from the anode are not sufficiently injected into a neighboring hole transport layer. Thus, driving voltage of the organic light-emitting device may be high or efficiency of the organic light-emitting device may be lowered, and holes remaining at interface between the anode and the neighboring hole transport layer in the organic light-emitting device cause deterioration of the hole transport layer. This may reduce the lifespan of the organic light-emitting device.

SUMMARY

Accordingly, the present disclosure is directed to an organic light-emitting device and an organic light-emitting display using the same that substantially obviate one or more of the issues due to limitations and disadvantages of the related art.

An aspect of the present disclosure is to provide an organic light-emitting device with improved anode hole injection efficiency and increase lifespan, and an organic light-emitting display using the same.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided an organic light-emitting device, including: an anode and a cathode opposite each other, an organic light-emitting layer between the anode and the cathode, and a hole transport unit between the anode and the organic light-emitting layer and including two or more pairs of hole injection layers and hole transport layers, each hole injection layer including a same hole injection material, each hole transport layer including a same hole transport material, respective ones of the hole injection layers and the hole transport layers being alternately disposed.

In another aspect, there is provided an organic light-emitting device, including: an anode and a cathode opposite each other, a charge generation layer between the anode and the cathode to divide two or more stacks between the anode and the cathode, a plurality of organic light-emitting layers respectively on each of the two or more stacks, and a hole transport unit on any one of the two or more stacks, the hole transport unit contacting the anode or the charge generation layer and including two or more pairs of hole injection layers and hole transport layers, each hole injection layer including a same hole injection material, each hole transport layer including a same hole transport material, respective ones of the hole injection layers and the hole transport layers being alternately disposed.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain various principles of the disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to some embodiments of the present disclosure, examples of which are illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

In the description of embodiments, when a structure is described as being positioned "on or above" or "under or below" another structure, this description should be construed as including a case in which the structures contact each other as well as a case in which a third structure is disposed therebetween.

In the following description, the Lowest Unoccupied Molecular Orbital (LUMO) level and the Highest Unoccupied Molecular Orbital (HUMO) level of a layer refer to the LUMO level and the HUMO level of a material constituting a major weight ratio of the corresponding layer, unless they refer to the LUMO level and the HUMO level of a dopant material doping the corresponding layer.

In the following description, a HOMO level may be an energy level measured through cyclic voltammetry (CV), in which an energy level is determined from a relative potential value to a reference electrode having a known potential value. For example, the HOMO level of a material may be measured using ferrocene having known oxidation potential value and reduction potential value.

In the following description, the term "doped" means that a material having different properties from a material occupying a major weight ratio of a layer (for example, materials having different properties being N-type and P-type materials or an organic material and an inorganic material) is added thereto at a weight ratio of less than 10%. In other words, a "doped" layer is a layer in which a host material and a dopant material may be discriminated in consideration of weight ratios thereof. In addition, the term "undoped" means all cases except for the case corresponding to the term "doped." For example, if a layer is formed of a single, same material or is formed of a mixture of materials having similar properties, the layer may be an undoped layer. For example, if at least one material forming a layer is P-type and all of the materials forming the layer are not N-type, the layer is an undoped layer. As another example, if at least one material forming a layer is an organic material and all of the materials forming the layer are not inorganic materials, the layer is an undoped layer. In another example, if all of the materials forming a layer are organic materials, at least one of the materials forming the layer is N-type, and at least another of the other materials is P-type, then, when the N-type material has a weight ratio of less than 10% or the P-type material has a weight ratio of less than 10%, the layer is a doped layer.

In the following description, an electroluminescence (EL) spectrum is calculated by multiplying (1) a photoluminescence (PL) spectrum, in which intrinsic properties of a light-emitting material, such as a dopant material or a host material included in an organic light-emitting layer, are reflected, by (2) an out-coupling emittance spectrum curve which is determined by the structure and optical properties of an organic light-emitting device including the thickness of organic layers, such as an electron transport layer.

In the following description, the term "stack" refers to a unit structure including a hole transport layer, or an organic layer having the hole transport layer, and an organic light-emitting layer disposed between the hole transport layer and an electron transport layer. The organic layer may further include a hole injection layer, an electron blocking layer, a hole blocking layer, an electron injection layer, etc., and the stack may further include other organic layers according to the structure and design of an organic light-emitting device.

Figure 1:
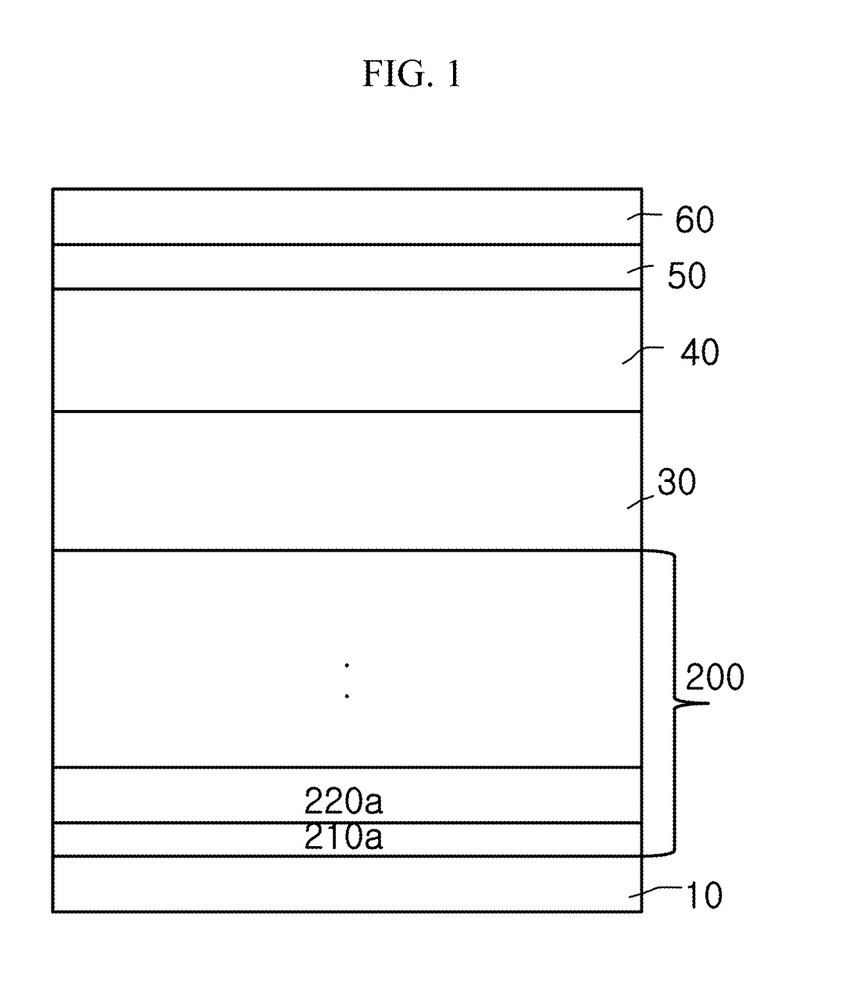
FIG. 1 is a cross-sectional view illustrating an organic light-emitting device in accordance with an embodiment of the present disclosure.

FIG. 1 is a cross-sectional view illustrating an organic light-emitting device in accordance with an embodiment of the present disclosure.

As shown in the FIG. 1 example, the organic light-emitting device in accordance with an embodiment of the present disclosure may include an anode 10 and a cathode 60 disposed opposite each other, an organic light-emitting layer 30 provided between the anode 10 and the cathode 60, and a hole transport unit 200 provided between the anode 10 and the organic light-emitting layer 30 and including two or more pairs of hole injection layers 210a, 210b, . . . formed of a single hole injection material and hole transport layers 220a, 220b, . . . formed of a single hole transport material, which are alternately disposed. In other words, in the hole transport unit 200, the hole injection layer 210a may be followed by the hole transport layer 220a, which may be followed by the hole injection layer 210b, which may be followed by the hole transport layer 220b, etc.

Further, as shown in the example of FIG. 1, an electron transport layer 40 and an electron injection layer 50 may be further provided between the organic light-emitting layer 30 and the cathode 60. However, embodiments are not limited thereto. For example, the electron transport layer 40 and the electron injection layer 50 may be provided as one layer, or the organic light-emitting layer 30 may include an electron transport material. Thus, the organic light-emitting layer 30 and the electron transport layer 40 may be provided as one layer without an interface (e.g., the electron injection layer 50) therebetween.

In the hole transport unit 200, the hole injection material has excellent electron affinity, and thus reduces barriers at the interface between the anode 10 and the hole injection layer 210 adjacent to the anode 10 to facilitate injection of holes. For example, the hole injection material may be any one of: 7,7,8,8-tetracyano-2,3,5,6-tetrafluoroquinodimethane (F4TCNQ), fluorine-substituted 3,4,9,10-perylentetracarboxilic dianhydride (PTCDA), cyano-substituted PTCDA, 1,4,5,8-naphthalene-tetracarboxilic dianhydride (NTCDA), hexanitrile hexaazatriphenylene (HAT) and hexaazatriphenylene-hexacarbonitrile (HAT-CN), or a derivative thereof.

Further, the hole transport material may be a material that has excellent hole transportability in the organic layer and thus has high hole mobility. For example, the hole transport material may be any one of: N,N'-bis-(1-naphthalenyl)-N, N'-bis-phenyl-(1,1'biphenyl)-4,4'-diamine (NPB, also referred to as N,N'-bis(naphthalene-1-yl)-N,N'-bis(phenyl) benzidine (NPD)), N,N'-bis(3-methylphenyl)-N,N'-diphenylbenzidine (TPD), s-TAD and 4,4',4"-tris(N-3-methylphenyl-N-phenyl-amino)-triphenylamine (MTDATA), or a derivative thereof.

Figure 2:
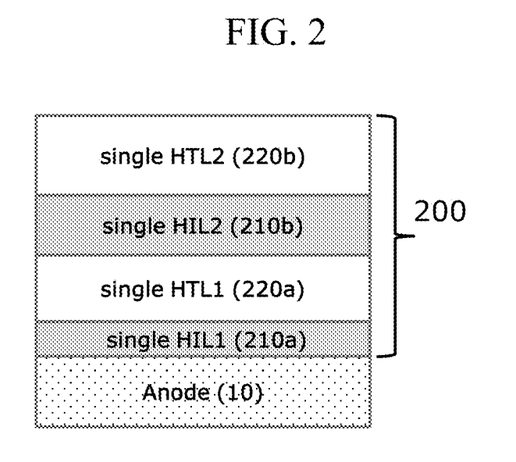
FIG. 2 is a cross-sectional view illustrating a hole transport unit on an anode in accordance with an embodiment of the present disclosure.
Figure 3:
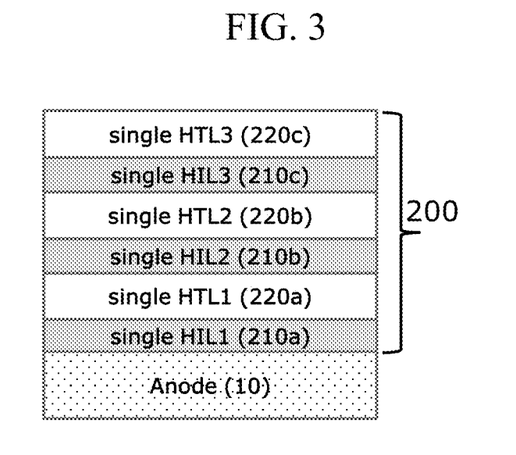
FIG. 3 is a cross-sectional view illustrating a hole transport unit on an anode in accordance with another embodiment of the present disclosure.
Figure 4:
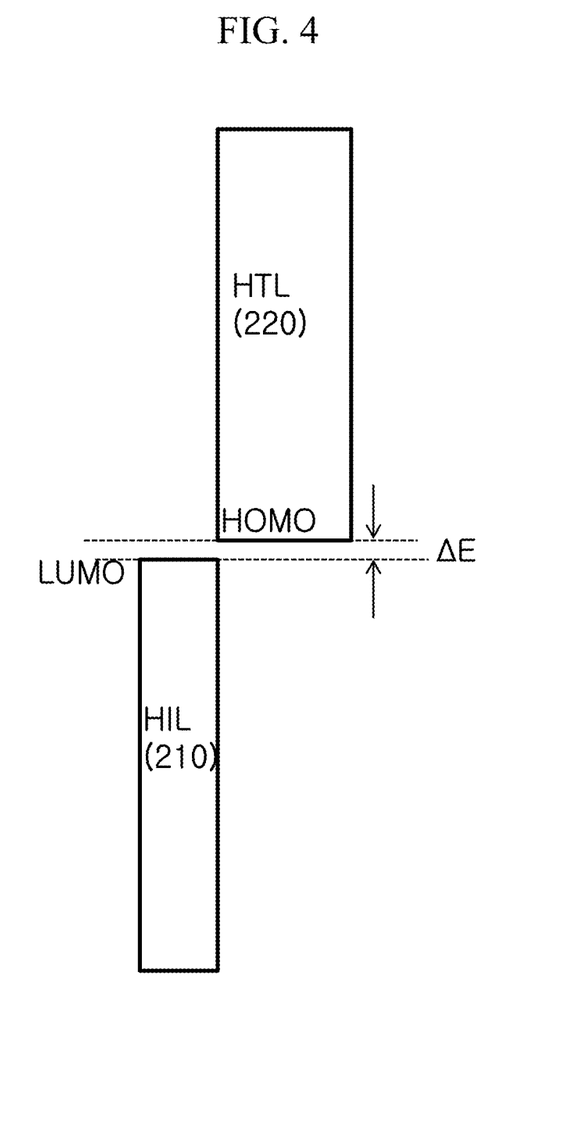
FIG. 4 is a band diagram of a hole injection layer and a hole transport layer of a hole transport unit in accordance with an embodiment of the present disclosure.

FIG. 2 is a cross-sectional view illustrating a hole transport unit on an anode in accordance with an embodiment of the present disclosure. FIG. 3 is a cross-sectional view illustrating a hole transport unit on an anode in accordance with another embodiment of the present disclosure. FIG. 4 is a band diagram of a hole injection layer and a hole transport layer of a hole transport unit in accordance with an embodiment of the present disclosure.

In an organic light-emitting device in accordance with an embodiment of the present disclosure, the hole transport unit 200 includes the hole injection layers 210a, 210b, . . . respectively formed of a single hole injection material and the hole transport layers 220a, 220b, . . . respectively formed of a single hole transport material, as shown in the examples of FIGS. 2 and 3, because it has been confirmed through experiments that performance of the hole transport unit 200 is lowered when a hole transport layer is doped with a hole injection material as a dopant material. That is, an organic light-emitting device in accordance with an embodiment of the present disclosure includes the hole transport unit 200 including a plurality of layers formed by depositing different kinds of materials having different energy band gaps as different layers. This may reduce lowering of performance due to mixing of different materials.

For example, if a process in which a hole injection material is mixed with a known hole transport layer is used, the hole injection material is combined with a material in the hole transport layer, changes overall physical properties of the hole transport layer or obstructs transport of holes of the hole transport layer, and thus, serves as a barrier in movement of the holes to the organic light-emitting layer. Here, it is estimated that performance degradation is observed. Such experimental details will be described later with reference to the accompanying drawings.

In an organic light-emitting device according to an embodiment of the present disclosure, the lowermost part of the hole transport unit 200 may contact the anode 10, and the uppermost part of the hole transport unit 200 may contact the organic light-emitting layer 30, as shown in the FIG. 1 example. In some cases, an electron blocking layer or a hole control layer, which may control the transport speed of holes transmitted to the organic light-emitting layer 30, may be further provided between the upper part of the hole transport unit 200 and the organic light-emitting layer 30.

Further, in an organic light-emitting device according to an embodiment of the present disclosure, disposition of two or more pairs of the hole injection layers 210a, 210b, respectively formed of a single hole injection material and the hole transport layers 220a, 220b, . . . respectively formed of a single hole transport material, which are alternately deposited, means that the hole transport unit 200 includes at least four layers, e.g., a hole injection layer 210a, a hole transport layer 220a, a hole injection layer 210b, and a hole transport layer 220b, which are sequentially deposited on the anode 10, as shown in the FIG. 2 example, and may further include another hole injection layer 210c and another hole transport layer 220c on the hole transport layer 220b, as exemplarily shown in the FIG. 3 example. Each of the hole injection layers 210a, 210b, . . . and the hole transport layers 220a, 220b, . . . of the hole transport unit 200 may be formed by depositing a single, same material. An interface may be formed between adjacent layers.

In an organic light-emitting device according to an embodiment of the present disclosure, the thicknesses of the hole injection layers 210a, 210b, . . . may be smaller than the thicknesses of the hole transport layers 220a, 220b, . . . . Among the hole injection layers 210a, 210b, . . . , the first hole injection layer 210a contacting the anode 10 may have the greatest thickness because the first hole injection layer 210a contacting the anode 10 may have the greatest interfacial barrier of the anode 10 with the organic layer. The hole injection layer 210a may have a designated thickness, such that holes may enter the hole transport unit 200 via the barrier. The hole injection layers 210a, 210b, . . . have thicknesses of about 10 Å to 40 Å. Thereamong, the first hole injection layer 210a may have a thickness of about 20 Å to 40 Å.

Although the hole transport unit 200 includes plural pairs of the hole injection layers 210a, 210b, . . . and the hole transport layers 220a, 220b, . . . , the hole transport unit 200 may not be deposited infinitely. That is, the hole transport unit 200 may set the position of the organic light-emitting layer 30 formed thereon. Thus, the total thickness of the hole transport unit 200 may be within the range of 150 Å to 2500 Å. If organic light-emitting devices respectively disposed in sub-pixels of an organic light-emitting display emit different colors of light, hole transport units 200 of the organic light-emitting devices in the respective sub-pixels may have different thicknesses. That is, the thickness of the hole transport unit 200 may be determined such that the intensity of light emitted from the organic light-emitting layer 30 is the greatest according to the resonant period of a wavelength corresponding to the light.

Further, the hole transport unit 200 has a positive function of transmitting holes to the organic light-emitting layer 30 so that the holes are combined with electrons transmitted from the cathode 60 to generate excitons and then to emit light. For this purpose, the hole transport layers 220a, 220b, . . . may occupy a majority of the total thickness of the hole transport unit 200, e.g., about 70% to 99% of the total thickness of the hole transport unit 200. That is, in the hole transport unit 200, the hole transport layers 220a, 220b, . . . may be thicker than the hole injection layers 210a, 210b, . . . .

In one embodiment, as shown in the FIG. 4 example, the Lowest Unoccupied Molecular Orbital (LUMO) level of a hole injection layer 210 of the hole transport unit 200 may be less than or equal to the Highest Occupied Molecular Orbital (HOMO) level of a hole transport layer 220. For example, a HOMO-LUMO band gap of the hole injection layer 210 may be spaced apart from a HOMO-LUMO band gap of the hole transport layer 220, even by a small distance. The LUMO level of the hole injection layer 210 may be lower than the HOMO level of the hole transport layer 220 by, e.g., 0.01 eV to 1.00 eV.

There may be a great difference in energy band gaps between the hole injection layer 210 and the hole transport layer 220 of the hole transport unit 200 to cause the hole injection layer 210 having a lower LUMO level to induce a function of generating charges. That is, electrons in the hole transport layer 220 having a relatively high HOMO level jump to the adjacent hole injection layer 210 having a low LUMO level, locations within the hole transport layer 220, from which the electrons are removed, may be filled with holes. Thus, the hole transport unit 200 has hole transport characteristics. For example, the LUMO level of the hole injection layer 210 may be lower than the HOMO level of the adjacent hole transport layer 220. As such, electrons may easily enter the hole injection layer 210, and the electrons may be trapped within the hole injection layer 210 having a lower LUMO level.

The HOMO level and the LUMO level may have negative values, and if the LUMO level of the hole injection layers 210a, 210b, . . . is lower than the HOMO level of the hole transport layers 220a, 220b, . . . then the absolute value of the LUMO level of the hole injection layers 210a, 210b, . . . may be greater than the absolute value of the HOMO level of the hole transport layers 220a, 220b, and the energy band gaps of the hole transport layer 220 and the hole injection layer 210 may not overlap and may be separated from each other, as shown in the example of FIG. 4. For example, a separation difference may not exceed 1 eV. A reason for this is that each of all organic materials has a lower HOMO level than a LUMO level. Thus, it may be difficult to synthesize a material for the hole injection layer 210 having a lower LUMO level than the HOMO level of the hole transport layer 220 by more than 1 eV. Also, it may be difficult to secure material stability. The above-described hole transport unit 200 may be applied to the above-described organic light-emitting device having a unit structure and contact an anode. In other embodiments, the above-described hole transport unit 200 may also be applied to an organic light emitting device of a structure having a plurality of stacks and may contact an anode or a charge generation layer of the structure having the plurality of stacks.

Figure 5:
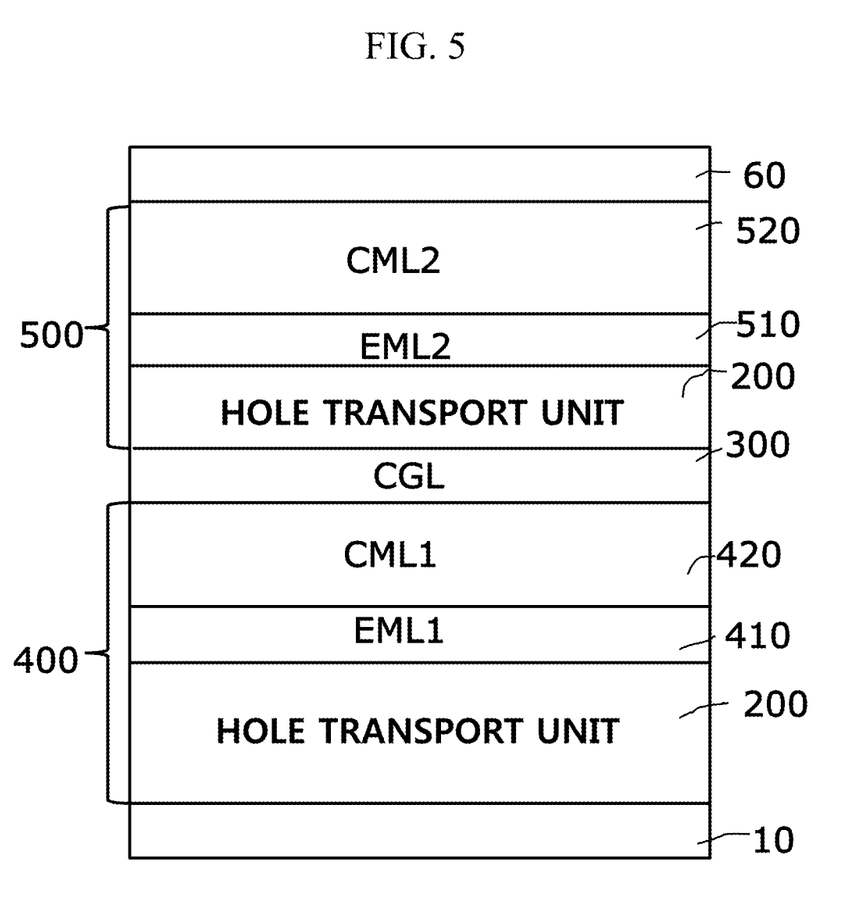
FIG. 5 is a cross-sectional view illustrating an organic light-emitting device in accordance with another embodiment of the present disclosure.

FIG. 5 is a cross-sectional view illustrating an organic light-emitting device in accordance with another embodiment of the present disclosure.

That is, as shown in the FIG. 5 example, a organic light-emitting device in accordance with this embodiment of the present disclosure may have a structure including a plurality of stacks. For example, the organic light-emitting device may include at least one charge generation layer 300, provided between an anode 10 and a cathode 60, and stacks 400 and 500, provided between the anode and cathode 10 and 60 and the charge generation layer 300.

If a plurality of charge generation layers 300 is provided, another stack may be further provided between the charge generation layers 300. Further, the respective stacks 400 and 500 may include hole transport units 200, organic light-emitting layers 410 and 510, and electron transport layers 420 and 520. The hole transport units 200 may have the same configuration and physical properties as the above-described hole transport unit 200 in accordance with the examples of FIGS. 1-3.

The charge generation layer 300 may contact the electron transport layer 420 of the lower stack 400. For example, if the charge generation layer 300 is formed by stacking n-type and p-type charge generation layers, the n-type charge generation layer may directly contact the electron transport layer 420, and the p-type charge generation layer may contact the hole transport unit 200 of the upper stack 500. As desired by circumstances, the charge generation layer 300 may be a single n-type charge generation layer. In this case, the hole transport unit 200 may have a function of a p-type charge generation layer.

Figure 6:
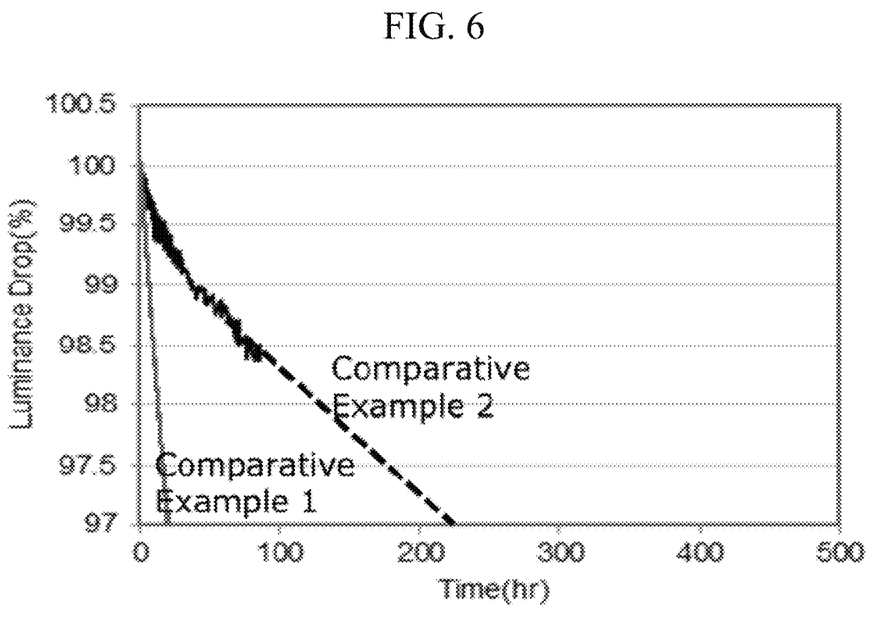
FIG. 6 is a graph comparatively showing lifespans of an organic light-emitting device of Comparative Example 1, in which a hole transport unit includes a layer formed of a hole transport material and a hole injection material mixed with each other, and an organic light-emitting device of Comparative Example 2, in which a hole transport unit includes a pair of a hole injection layer formed of a single, same material and a hole transport layer formed of a single, same material.
Figure 7:
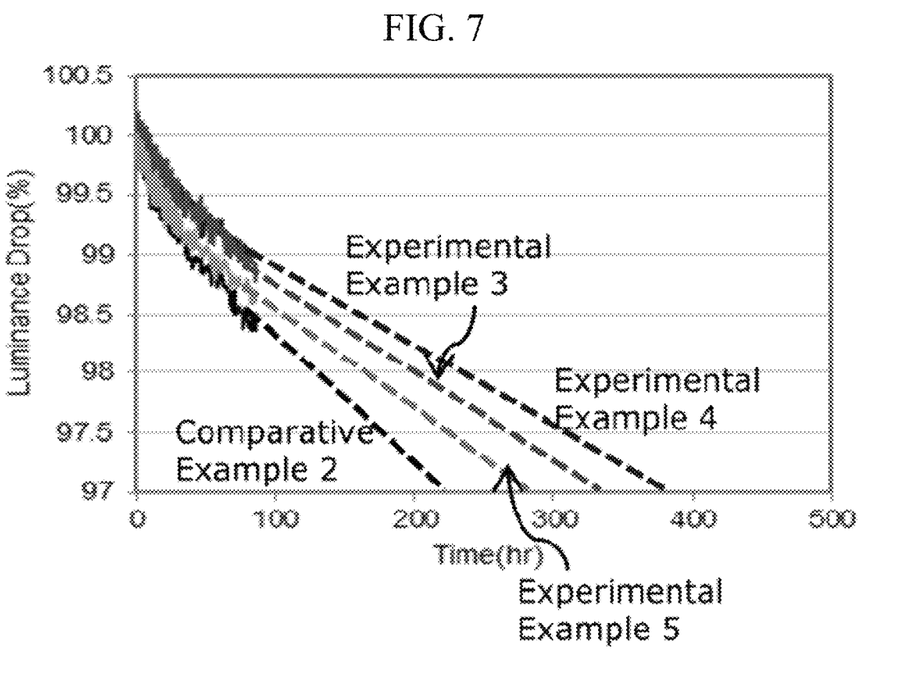
FIG. 7 is a graph comparatively showing lifespans of the organic light-emitting device of Comparative Example 2 with organic light-emitting devices in accordance with the embodiments of the present disclosure.

FIG. 6 is a graph comparatively showing lifespans an organic light-emitting device of Comparative Example 1, in which a hole transport unit includes a layer formed of a hole transport material and a hole injection material mixed with each other, and an organic light-emitting device of Comparative Example 2, in which a hole transport unit includes a pair of a hole injection layer formed of a single, same material and a hole transport layer formed of a single, same material. FIG. 7 is a graph comparatively showing lifespans of the organic light-emitting device of Comparative Example 2 and the organic light-emitting devices in accordance with the embodiments of the present disclosure.

With reference to FIGS. 6 and 7 and Tables 1 and 2 below, in Comparative Example 1 (row ①), 3 wt % of a hole injection material is mixed with a hole transparent material, compared to the hole transport unit 200 in accordance with an embodiment of the present disclosure. In Comparative Example 2 (row ②) a pair of layers, including a hole injection layer and a hole transport layer, is provided through deposition.

Further, Experimental Example 1 (row ③) and Experimental Example 2 (row ④) relate to the embodiment of the present disclosure shown in the FIG. 2 example, in which two pairs of hole injection layers formed of a single, same material and hole transport layers formed of a single, same material are alternately disposed through deposition. On the presumption that the total thickness of a pair of the hole injection layer and the hole transport layer is 220 Å, the hole injection layers may have a thickness of 20 Å and the hole transport layers may have a thickness of 200 Å in Experimental Example 1, and the hole injection layers may have a thickness of 35 Å and the hole transport layers may have a thickness of 185 Å in Experimental Example 2.

Further, Experimental Example 3 (row ⑤) relates to the embodiment of the present disclosure shown in the FIG. 3 example, in which three pairs of hole injection layers formed of a single, same material and hole transport layers formed of a single, same material are alternately disposed through deposition. In this case, the hole injection layers may have a thickness of 20 Å, and the hole transport layers may have a thickness of 135 Å.

In the comparative examples and experimental examples, experiments were carried out in a state in which the total thickness of the hole transport layers or the hole transport unit is within the range of 400 Å to 470 Å. Such a state satisfies the resonant condition of the organic light-emitting layer on which the hole transport layers or the hole transport unit is located.

TABLE 1

| | HIL1 | HTL1 | HIL2 | HTL2 | HIL3 | HTL3 | NOTE |
|---|---|---|---|---|---|---|---|
| ① | Hole transport material + 3 wt % of hole injection material | | | | | | Doping-type |
| ② | 70 Å | 400 Å | | — | | | Layered-type |
| ③ | 20 Å | 200 Å | 20 Å | 200 Å | | — | |
| ④ | 35 Å | 185 Å | 35 Å | 185 Å | | — | |
| ⑤ | 20 Å | 135 Å | 20 Å | 135 Å | 20 Å | 135 Å | |

TABLE 2

| | Driving voltage (V) | Efficiency (%) | CIEx | CIEy |
|---|---|---|---|---|
| ① | 9.0 | 40 | 0.131 | 0.080 |
| ② | 7.3 | 100 | 0.131 | 0.075 |
| ③ | 7.9 | 118 | 0.131 | 0.076 |
| ④ | 7.5 | 110 | 0.133 | 0.072 |
| ⑤ | 7.9 | 111 | 0.127 | 0.092 |

Table 1 represents thickness conditions of the respective comparative examples and experimental examples. Table 2 and FIGS. 6 and 7 represent experimental results thereof.

As shown in Table 2, if the hole transport layer is doped with the hole injection material in Comparative Example 1, driving voltage is raised to 9.0 V by 15% to 25% of driving voltages of Experimental Examples 1 to 3 (the embodiments shown in FIGS. 2 and 3 referred to as first and second embodiments respectively hereafter) and Comparative Example 2. Therefore, it may be confirmed that driving voltage of the doped structure is raised, compared to the layered structures.

Further, on the presumption that efficiency of Comparative Example 2 is 100%, efficiencies of Comparative Example 1 and Experimental Examples 1, 2, and 3 are acquired by comparing measured data of luminance characteristics to current Cd/A thereof with data of example 2. If the efficiency of Comparative Example 2 having a layered structure including a pair of the hole injection layer and the hole transport layer is 100%, efficiencies of the first and second embodiments of the present disclosure are raised to 110% or more of the Comparative Example 2 efficiency. Thus, it may be confirmed that, when two or more pairs of hole injection layers and hole transport layers are alternately stacked, efficiency is increased. That is, under the same current conditions, the first and second embodiments of the present disclosure have luminance values enhanced by 10% or more, compared to the luminance value of Comparative Example 2. Thus, it may be confirmed that alternate deposition of two or more pairs of hole injection layers formed of a single hole injection material and hole transport layers formed of a single hole transport material is effective.

Further, in Table 2, it may be confirmed that CIEx and CIEy values of comparative examples 1 and 2 and the first and second embodiments of the present disclosure are substantially equal or similar. This means that, if the same light-emitting layer is applied to comparative examples 1 and 2 and the first and second embodiments of the present disclosure, approximately equivalent color expression is possible under the respective conditions.

Table 2 represents that the organic light-emitting devices of the present disclosure have remarkably low driving voltage, compared to Comparative Example 1, and have improved efficiency, compared to comparative examples 1 and 2. Further, through comparison between Comparative Example 2 and the first and second embodiments of the present disclosure, driving voltage of Comparative Example 2 is decreased more than driving voltages of the first and second embodiments of the present disclosure, but the efficiency of Comparative Example 2 is lower than efficiencies of the first and second embodiments of the present disclosure by 10% or more. Thus, if the same efficiency (e.g., 100%) is implemented, driving voltage of Comparative Example 2 is substantially higher than driving voltages of the first and second embodiments of the present disclosure. In other words, the first and second embodiments can be driven at a lower driving voltage to achieve the same 100% efficiency of the Comparative Example 2. Further, with reference to FIGS. 6 and 7, when the embodiments of the present disclosure are applied, the organic light-emitting devices of the present disclosure may have excellent lifespan in comparison with the comparative examples.

In FIGS. 6 and 7, lifespans of the organic light-emitting devices are measured until luminance is decreased from 100%, at an initial stage, to 97% at a later time, e.g., a decrease of about 3%.

As shown in the FIG. 6 example, it may be confirmed that the lifespan of the organic light-emitting device of Comparative Example 2, including a pair of the hole injection layer and hole transport layer, is extended by 10 or more times the lifespan of the organic light-emitting device of Comparative Example 1, including the doped hole transport layer. Therefore, as shown in the FIG. 7 example, it may be confirmed that the lifespans of the organic light-emitting devices of the first and second embodiments of the present disclosure are extended by 1.4 to 1.9 times the lifespan of the organic light-emitting device of Comparative Example 2.

Through the experiment of FIG. 6, it was confirmed that the lifespan of the organic light-emitting device including the hole transport layer doped with the dopant material is remarkably shortened, compared to the organic light-emitting device including the hole injection layer formed of the hole injection material and the hole transport layer formed of the hole transport material, which are alternately stacked.

The present inventors have considered the cause of shortening lifespan of the doped structure (e.g., Comparative Example 1). A dopant material was added to assist generation of charges in a hole transport layer. However, the dopant material in the hole transport layer decreases chemical stability of the hole transport layer, directly reacts with a hole transport material, does not fulfill a charge generation function, and causes malfunction of the hole transport material.

Embodiments of the present disclosure may, from the viewpoint of such lifespan difference, determine effects of a layered structure of a single hole injection material and a single hole transport material, and may deduce a structure in which two or more pairs of hole injection layers formed of a single, same material and hole transport layers formed of a single, same material are stacked to have improved lifespan, compared to Comparative Example 2. That is, if a layered structure including layers, each of which is formed of a single, same material, is applied, materials of adjacent layers do not influence the opposite layers except at the interface therebetween. Thus, internal chemical stability of the layers may be acquired, and chemical stability of the respective layers may be maintained. Thus, the structure may be driven for a long time.

In Tables 1 and 2 and FIG. 7, effect differences among Experimental Examples 1 to 3 are caused by thickness differences between a single hole injection material and a single hole transport material, which are stacked in a plural pairs.

In terms of lifespan, when two pairs of hole injection layers formed of a single, same material and hole transport layers formed of a single, same material are alternately stacked, the longest lifespan may be acquired. For example, the hole injection layers may have a thickness of 35 Å and the hole transport layers may have a thickness of 185 Å. It has been confirmed that the lifespans of the organic light-emitting devices decrease in order of Experimental Example 4, Experimental Example 3, and Experimental Example 5. In general, in a structure in which a hole transport layer is doped with a hole injection material as a dopant material, a small amount of the hole injection material, e.g., 5 wt % or less of the hole injection material is injected into the hole transport layer, an injection depth of the hole injection material is limited to 10 Å or less and, thus, a thickness occupied by the hole injection material is very small compared to the total thickness of the hole transport layer. However, the above experiment indicates that, in each pair of the hole injection layer and the hole transport layer of the hole transport unit of the organic light-emitting device of the present disclosure, the hole transport layer should assure a designated thickness of 10 Å to 40 Å to achieve normal operation. That is, if one hole injection layer and one hole transport layer are provided in a pair, a ratio of the hole injection layer to the hole transport layer may be in a range of, e.g., 1:10 to 1:5. Thus, the ratio of the hole injection layers to the overall hole transport unit of the present disclosure may be increased, compared to Comparative Example 1, to achieve normal operation of the respective hole injection layers.

Further, thickness arrangement of the hole injection layers and the hole transport layers of the hole transport unit may influence a hole transport speed, thereby controlling the width of an emission zone. That is, if two or more pairs of hole injection layers formed of a single, same material and hole transport layers formed of a single, same material are provided, both efficiency and lifespan of the organic light-emitting device may be remarkably increased, compared to Comparative Example 2.

Figure 8:
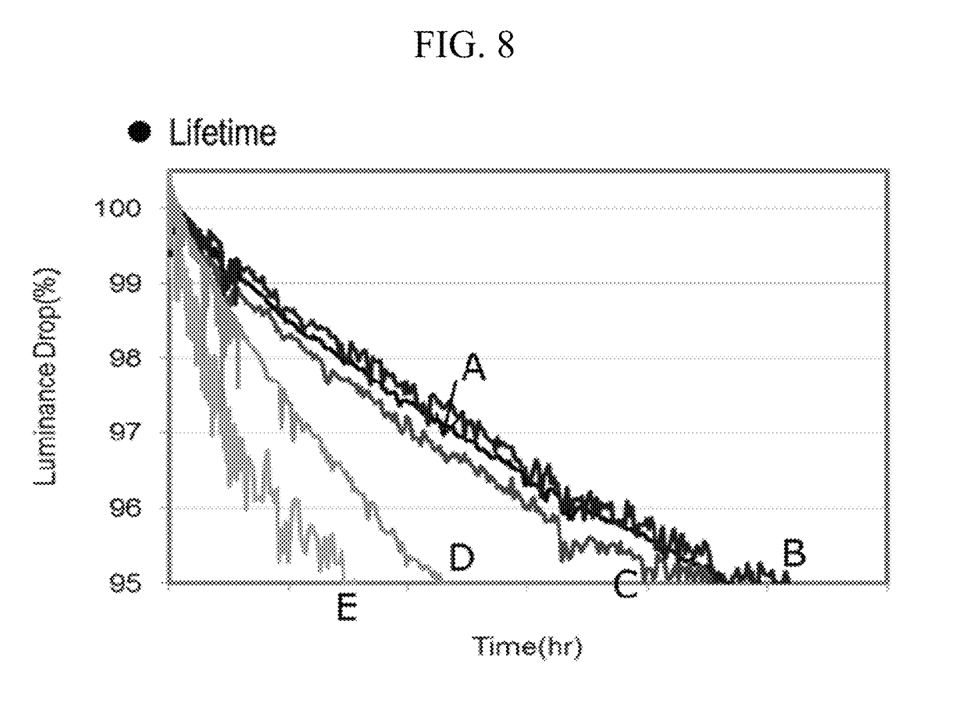
FIG. 8 is a graph comparatively showing lifespans of organic light-emitting devices of experimental examples, in which the same hole injection material and different hole transport materials are used.

FIG. 8 is a graph comparatively showing lifespans of organic light-emitting devices of experimental examples, in which the same hole injection material is used for all examples, but different hole transport materials are used for each example.

In the experimental examples of FIG. 8, lifespans of organic light-emitting devices shown in FIG. 1, which include hole transport layers formed of hole transport materials A to E having different HOMO levels, are measured, as shown in Table 3 below. In this case, hole injection layers contacting the hole transport layers are formed of the same material having a LUMO level of −5.46 eV and a HOMO level of −9 eV.

TABLE 3

| Hole transport material | Driving voltage (V) | HOMO (eV) | LUMO (eV) |
|---|---|---|---|
| A | 7.2 | −5.23 | −2.17 |
| B | 7.3 | −5.36 | −2.26 |

TABLE 3-continued

| Hole transport material | Driving voltage (V) | HOMO (eV) | LUMO (eV) |
|---|---|---|---|
| C | 7.2 | −5.4 | −2.4 |
| D | 7.8 | −5.52 | −2.52 |
| E | 8.0 | −5.61 | −2.51 |

With reference to FIG. 8, it may be confirmed that, if the HOMO level of the hole transport material, such as the hole transport material D or E, is lower than the LUMO level (−5.46 eV) of the hole injection material (in this case, there is an overlapping section of energy band gaps between a hole injection layer and a hole transport layer), the lifespan of the organic light-emitting device is remarkably shortened, compared to OLED configurations in which the HOMO level of the hole transport material, such as the hole transport material A, B or C, is higher than the LUMO level (−5.46 eV) of the hole injection material (in this case, energy band gaps of a hole injection layer and a hole transport layer are spaced apart from each other).

Further, it may be confirmed through Table 3 that, if the HOMO level of the hole transport material, such as the hole transport material D or E, is lower than the LUMO level (−5.46 eV) of the hole injection material (in this case, there is an overlapping section of energy band gaps between a hole injection layer and a hole transport layer), driving voltage (7.8 V or 8.0 V) of the organic light-emitting device is higher than driving voltage if the HOMO level of the hole transport material, such as the hole transport material A, B, or C, is higher than the LUMO level (−5.46 eV) of the hole injection material (in this case, energy band gaps of a hole injection layer and a hole transport layer are spaced apart from each other) by 10% or more. That is, the hole transport unit of the organic light-emitting device of the present disclosure, in which two or more pairs of hole injection layers formed of a single, same material and hole transport layers formed of a single, same material are stacked and energy band gaps of the hole injection layers and the hole transport layers are spaced apart from each other, has driving voltage reduction effects, compared to a structure in which energy band gaps of hole injection layers and hole transport layers overlap each other.

That is, as the organic light-emitting device according to an embodiment of the present disclosure, if two or more pairs of hole injection layers formed of a single, same material and hole transport layers formed of a single, same material are stacked, and energy band gaps of the hole injection layers and the hole transport layers are spaced apart from each other, reduction in driving voltage, improvement in efficiency, and remarkable enhancement in lifespan may be expected. In the FIG. 8 example, a gradation of a horizontal axis represents 100 hours, and use of the hole transport materials A to C to form the hole transport layers causes lifespan extension effects of about 2 times or more, compared to use of the hole transport materials D and E to form the hole transport layers.

The HOMO levels of the hole transport layers and the LUMO levels of the hole injection layers of the above-described experimental examples not limited to Table 3. Further, if the LUMO level of the hole injection layer 210 is equal to or lower than the HOMO level of the hole transport layer 220, reduction in driving voltage, improvement in efficiency and remarkable enhancement in lifespan are expected, as described above.

Figure 9:
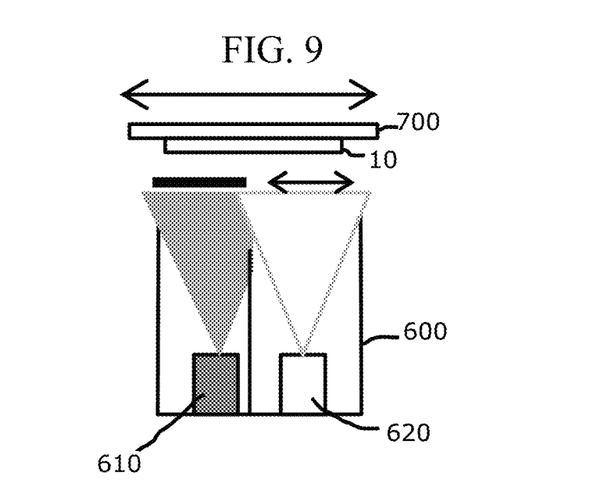
FIG. 9 is a view illustrating a method of fabricating a hole transport unit of an organic light-emitting device in accordance with an embodiment of the present disclosure.

FIG. 9 is a view illustrating a method of fabricating a hole transport unit of an organic light-emitting device in accordance with an embodiment of the present disclosure.

First, a method of fabricating the hole transport unit in accordance with an embodiment of the present disclosure may be carried out. A substrate 700 including anodes 10 of respective sub-pixels may be prepared and then disposed such that the anodes 10 face a hole transport unit supply chamber 600. In one example, the hole transport unit supply chamber 600 may be provided with a hole injection material supply source 610 and a hole transport material supply source 620.

Thereafter, the hole injection material supply source 610 and the hole transport material supply source 620 may sequentially supply corresponding materials to the substrate 700, thereby forming a hole injection layer 210 and a hole transport layer 220. Through repetition of such a process, two or more pairs of hole injection layers 210 and hole transport layers 220 may be formed, and thereby, a hole transport unit 200 may be fabricated. In such a process of fabricating the hole transport unit 200, the hole transport material supply source 620 may be repetitively used while varying the scan direction of the substrate 700.

The substrate 700 may be used in an organic light-emitting display. In one example, the substrate 700 may include a thin film transistor connected to the lower surface of a first electrode 10 of each of the sub-pixels. The formation method of the thin film transistor is not restricted, the thin film transistor may include a gate electrode, an active layer, a source electrode and a drain electrode, and the source electrode or the drain electrode may be connected to the first electrode. Further, the active layer may include an amorphous silicon layer, a polysilicon layer, a double layer including the same, a plurality of layers including the same or an oxide film semiconductor, or may be changed to various types. Embodiments are not limited to these examples.

In a related art structure in which a hole transport layer is doped with a hole injection material as a dopant material, it is difficult to properly disperse a small amount of the dopant material and to quantify dispersion of the dopant material in the process. Thus, it is difficult to achieve uniform performance of the hole transport layer due to non-uniform distribution of the dopant material within the hole transport layer in the related art. However, as described above, the hole transport unit of the organic light-emitting device in accordance with an embodiment of the present disclosure has a layered structure of hole transport layers formed of a single, same material and hole injection layers formed of a single, same material, and may thus solve the above problem caused by difficulty in quantification of the dopant material. The organic light-emitting device in accordance with an embodiment of the present disclosure may be applied to each sub-pixel, and thus, may be applied to an organic light-emitting display.

Figure 10:
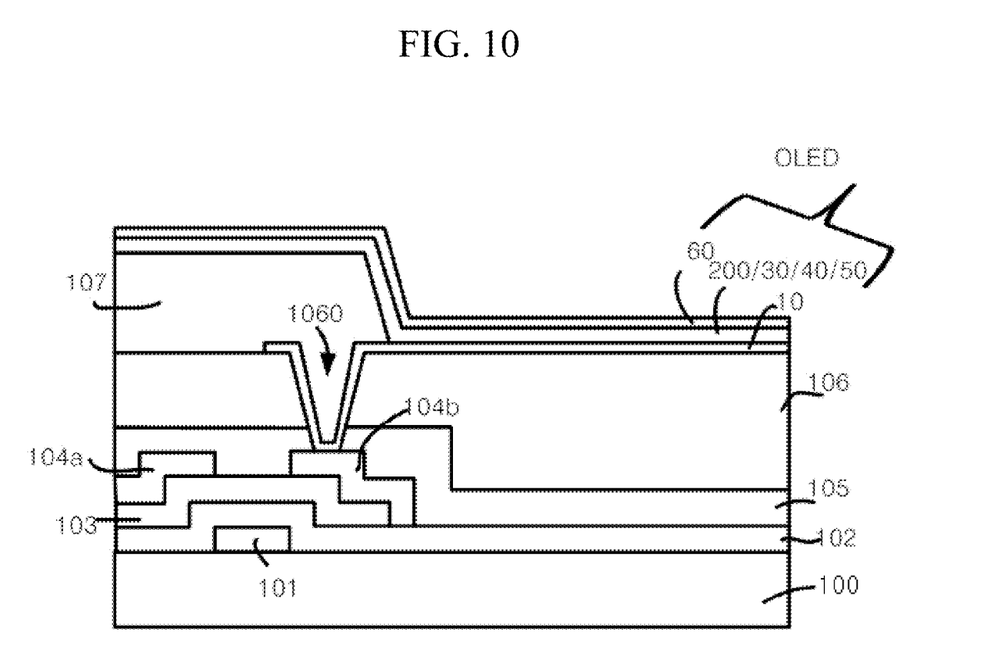
FIG. 10 is a cross-sectional view illustrating an organic light-emitting display in accordance with an embodiment of the present disclosure.

FIG. 10 is a cross-sectional view illustrating an organic light-emitting display in accordance with an embodiment of the present disclosure.

As shown in the FIG. 10 example, the organic light-emitting display in accordance with an embodiment of the present disclosure may include a substrate 100 including a plurality of sub-pixels, thin film transistors (TFTs) of the respective sub-pixels being provided on the substrate 100, and organic light-emitting devices (OLED) including anodes 10 and cathodes 60. In one example, the anode 10 or the cathode 60 of each organic light-emitting device may be connected to each TFT. Although the example of FIG. 10 illustrates one sub-pixel, sub-pixels having the same shape may be substantially arranged in a matrix on the substrate 100.

In one example, the thin film transistor may includes a gate electrode 101 provided in a designated region on the substrate 100, a gate insulating film 102 formed on the substrate 100 to cover the gate electrode 101, a semiconductor layer 103 formed on the gate insulating film 102 to correspond to the gate electrode 101, and a source electrode 104a and a drain electrode 104b formed at both sides of the semiconductor layer 103. Further, an inorganic protective film 105 and an organic protective film 106 may be sequentially provided to cover the source electrode 104a and the drain electrode 104b. The anode 10 or the cathode 60 may be connected to the drain electrode 104b via a contact hole 1060 formed through the organic protective film 106 and the inorganic protective film 105 to expose a part of the drain electrode 104b.

For example, if the anode 10 is connected to the drain electrode 104b, an organic stack, in which a hole transport unit 200, an organic light-emitting layer 30, an electron transport layer 40, and an electron injection layer 50 are sequentially deposited, may be formed on the anode 10, and the cathode 60 may be provided on the organic stack. The organic stack may be replaced with the stack structure shown in the FIG. 5 example.

On the other hand, if the cathode 60 is connected to the drain electrode 104b, an organic stack, in which the above-described elements are provided in reverse order, may be provided. That is, an electron injection layer 50, an electron transport layer 40, an organic light-emitting layer 30, and a hole transport unit 20 may be sequentially deposited.

In some cases, a hole injection layer may be further provided between the anode 10 and a hole transport layer of the hole transport unit 200, and an electron injection layer may be further provided between the electron transport layer and the cathode 60. Further, although the FIG. 10 example illustrates a bank 107 provided to define an emission zone, the bank 107 may be omitted, and the emission zone may be defined by other structures. The organic stack and the cathode 60 may be provided in common to all sub-pixels. Colors of the sub-pixels may be discriminated by color filters.

Moreover, although FIG. 10 illustrates the organic light-emitting device in accordance with the embodiment shown in FIG. 1, the disclosure is not limited thereto. For example, the organic light-emitting device in accordance with the embodiment shown in FIG. 5, in which a plurality of stacks is provided between an anode and a cathode, may be provided.

The above-described organic light-emitting display may achieve color expression by emitting different colors of light through the organic light-emitting layers of the respective sub-pixels, or may achieve color expression by adding a color filter layer to a light-emitting portion of a common organic light-emitting layer.

Such an organic light-emitting display including the above-described organic light-emitting device may have the same effects as the above-described organic light-emitting device. As apparent from the above description, an organic light-emitting device and an organic light-emitting display using the same in accordance with an embodiment of the present disclosure may have effects described below.

First, hole injection layers may be formed of a single, same material and hole transport layers may be formed of a single, same material, and plural pairs of the hole injection layers and the hole transport layers may be alternately deposited to form a hole transport unit, thereby achieving reduction in driving voltage and improvement in efficiency and lifespan.

Second, in a related art structure in which a hole transport layer is doped with a hole injection material as a dopant material, it is difficult to properly disperse a small amount of the dopant material and to quantify dispersion of the dopant material in the process. Thus, it is difficult to achieve uniform performance of the hole transport layer due to non-uniform distribution of the dopant material in the hole transport layer in the related art. However, the hole transport unit of the organic light-emitting device in accordance with an embodiment of the present disclosure has a layered structure of the hole transport layers formed of a single, same material and the hole injection layers formed of a single, same material, and may thus solve such a problem.

It will be apparent to those skilled in the art that various modifications and variations may be made in the present disclosure without departing from the technical idea or scope of the disclosure. Thus, it is intended that embodiments of the present disclosure cover the modifications and variations of the disclosure provided they come within the scope of the appended claims and their equivalents.

What is claimed is:

1. An organic light-emitting device, comprising:
an anode and a cathode opposite each other;
an organic light-emitting layer between the anode and the cathode; and
a hole transport unit between the anode and the organic light-emitting layer and including two or more pairs of hole injection layers formed of a single hole injection material and hole transport layers formed of a single hole transport material, the hole injection layers and the hole transport layers being alternately disposed,
wherein a LUMO level of the hole injection layers is less than or equal to a HOMO level of the hole transport layers.

2. The organic light-emitting device of claim 1, wherein the LUMO level of the hole injection layers is less than the HOMO level of the hole transport layers by 0.01 eV to 1.00 eV.

3. The organic light-emitting device of claim 1, wherein the hole injection material comprises any one of: 7,7,8,8-tetracyano-2,3,5,6-tetrafluoroquinodimethane (F4TCNQ), fluorine-substituted 3,4,9,10-perylentetracarboxilic dianhydride (PTCDA), cyano-substituted PTCDA, 1,4,5,8-naphthalene-tetracarboxilic dianhydride (NTCDA), hexanitrile hexaazatriphenylene (HAT) and hexaazatriphenylene-hexacarbonitrile (HAT-CN), or a derivative thereof.

4. The organic light-emitting device of claim 1, wherein the hole transport material comprises any one of: N,N'-bis-(1-naphthalenyl)-N,N'-bis-phenyl-(1,1'biphenyl)-4,4'-diamine (NPB, also referred to as N,N'-bis(naphthalene-1-yl)-N,N'-bis(phenyl)benzidine (NPD)), N,N'-bis(3-methylphenyl)-N,N'-diphenylbenzidine (TPD), s-TAD and 4,4',4''-tris(N-3-methylphenyl-N-phenyl-amino)-triphenylamine (MTDATA), or a derivative thereof.

5. The organic light-emitting device of claim 1, wherein:
the thickness of the hole injection layers is less than the thickness of the hole transport layers;
the thickness of the hole transport layers is 10 Å to 40 Å; and
the total thickness of the hole transport unit is 150 Å to 2500 Å.

6. The organic light-emitting device of claim 1, wherein each hole injection layer comprises a same hole injection material and each hole transport layer comprises a same hole transport material.

7. An organic light-emitting device, comprising:
an anode and a cathode opposite each other;
a charge generation layer between the anode and the cathode to divide two or more stacks between the anode and the cathode;
a plurality of organic light-emitting layers respectively on each of the two or more stacks; and
a hole transport unit on any one of the two or more stacks, the hole transport unit contacting the anode or the charge generation layer and comprising two or more pairs of hole injection layers formed of a single hole injection material and hole transport layers formed of a single hole transport material, the hole injection layers and the hole transport layers being alternately disposed,
wherein a LUMO level of the hole injection layers is less than or equal to a HOMO level of the hole transport layers.

8. An organic light-emitting display, comprising:
a substrate comprising a plurality of sub-pixels;
a plurality of thin film transistors respectively in the each of the plurality of sub-pixels; and
a plurality of the organic light-emitting devices comprising an anode and a cathode opposite each other, an organic light emitting layer between the anode and the cathode and a hole transport unit between the anode and the organic light emitting layer and including two or more pairs of hole injection layers formed of a single hole injection material and hole transport layers formed of a single hole transport material, the hole injection layers and the hole transport layers being alternately disposed,
wherein one of the anode or the cathode of each organic light-emitting device is connected to one of the thin film transistors, and
wherein a LUMO level of the hole injection layers is less than or equal to a HOMO level of the hole transport layers.

9. The organic light emitting display of claim 8, wherein the LUMO level of the hole injection layers is less than the HOMO level of the hole transport layers by 0.01 eV to 1.00 eV.

10. The organic light-emitting device of claim 7, wherein:
the charge generation includes at least an n-type layer and a p-type layer; and
the p-type layer directly contacts a corresponding hole transport unit.

* * * * *